(12) United States Patent
Kim et al.

(10) Patent No.: US 12,146,092 B2
(45) Date of Patent: Nov. 19, 2024

(54) ETCHING COMPOSITION, METHOD FOR ETCHING INSULATING FILM OF SEMICONDUCTOR DEVICES USING THE SAME AND METHOD FOR PREPARING SEMICONDUCTOR DEVICES (71) Applicants: SK Innovation Co., Ltd., Seoul (KR); SK INC., Seoul (KR)

(72) Inventors: Cheol Woo Kim, Daejeon (KR); Kwang Kuk Lee, Daejeon (KR); Jae Hoon Kwak, Yeongju-si (KR); Young Bom Kim, Yeongju-si (KR); Jung Ha Shin, Yeongju-si (KR); Jong Ho Lee, Yeongju-si (KR); Jin Kyung Jo, Yeongju-si (KR)

(73) Assignees: SK Innovation Co., Ltd., Seoul (KR); SK INC., Seoul (KR)

( * ) Notice: Subject to any disclaimer, the term of this patent is extended or adjusted under 35 U.S.C. 154(b) by 261 days.

(21) Appl. No.: 16/993,424

(22) Filed: Aug. 14, 2020

(65) Prior Publication Data
US 2021/0062088 A1 Mar. 4, 2021

(30) Foreign Application Priority Data
Aug. 29, 2019 (KR) .......................... 10-2019-0106888

(51) Int. Cl.
C09K 13/04 (2006.01)
C09K 13/06 (2006.01)
(Continued)

(52) U.S. Cl.
CPC .............. C09K 13/04 (2013.01); C09K 13/06 (2013.01); C09K 13/08 (2013.01);
(Continued)

(58) Field of Classification Search
None
See application file for complete search history.

(56) References Cited

U.S. PATENT DOCUMENTS

2018/0346811 A1* 12/2018 Lee ...................... H01L 21/465
2019/0074188 A1* 3/2019 Cooper ............. H01L 21/30604
2020/0263087 A1 8/2020 Lim et al.

FOREIGN PATENT DOCUMENTS

CN 102477260 A 5/2012
CN 102817035 A 12/2012
(Continued)

OTHER PUBLICATIONS

Office Action dated Dec. 18, 2023, issued in Taiwanese Patent Application No. 109128042.
(Continued)

Primary Examiner — Jiong-Ping Lu
(74) Attorney, Agent, or Firm — Oblon, McClelland, Maier & Neustadt, L.L.P.

(57) ABSTRACT

An etching composition includes phosphoric acid, a silane compound comprising at least one silicon (Si) atom, and an organic phosphate represented by Formula 1 below:

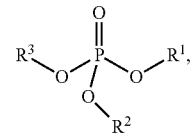

[Formula 1]

wherein $R^1$ to $R^3$ are independently hydrogen, or a substituted or unsubstituted hydrocarbyl group, and at least one of $R^1$ to $R^3$ is a substituted or unsubstituted hydrocarbyl group.

14 Claims, 1 Drawing Sheet (51) Int. Cl.
*C09K 13/08* (2006.01)
*H01L 21/3105* (2006.01)
*H01L 21/311* (2006.01)
*H01L 21/762* (2006.01)

(52) U.S. Cl.
CPC .. *H01L 21/31053* (2013.01); *H01L 21/31111* (2013.01); *H01L 21/76224* (2013.01)

(56) References Cited

FOREIGN PATENT DOCUMENTS

| CN | 107345137 A | | 11/2017 | |
|----|----|----|----|----|
| CN | 109841511 A | | 6/2019 | |
| EP | 1536291 | * | 6/2005 | ............... G03F 7/42 |
| JP | 2006098421 | * | 4/2006 | ............... C11D 7/08 |
| JP | 2016-029717 A | | 3/2016 | |
| JP | 2018-538692 A | | 12/2018 | |
| JP | 2020013991 | * | 1/2020 | ........... H01L 21/306 |
| KR | 10-2008-0027244 A | | 3/2008 | |
| KR | 10-2016-0010312 A | | 1/2016 | |
| KR | 10-2017-0093004 | | 8/2017 | |
| KR | 10-2018-0133226 | | 12/2018 | |
| TW | 201734181 A | | 10/2017 | |
| TW | 201920615 A | | 6/2019 | |
| WO | WO 2006/124201 A2 | | 11/2006 | |
| WO | WO2015190479 | * | 12/2015 | ............ C09J 201/00 |
| WO | WO 2018/124705 A1 | | 7/2018 | |
| WO | WO2020185762 | * | 9/2020 | ............. C09K 13/06 |

OTHER PUBLICATIONS

Office Action dated Mar. 10, 2023, in Chinese Patent Application No. 202010827110.0 filed Aug. 17, 2020.
Office Action issued Jul. 15, 2024, in Korean Application No. 10-2019-0106888.
Office Action issued Jul. 31, 2024, in Japan Application No. 2020-141534.

* cited by examiner

ETCHING COMPOSITION, METHOD FOR ETCHING INSULATING FILM OF SEMICONDUCTOR DEVICES USING THE SAME AND METHOD FOR PREPARING SEMICONDUCTOR DEVICES

CROSS-REFERENCE TO RELATED APPLICATION(S)

This application claims benefit of priority to Korean Patent Application No. 10-2019-0106888 filed on Aug. 29, 2019, in the Korean Intellectual Property Office, the disclosure of which is incorporated herein by reference in its entirety.

BACKGROUND

1. Field

The present disclosure relates to an etching composition, particularly, to an etching composition having a high selection ratio, capable of selectively removing a nitride film while minimizing an etching rate of an oxide film.

2. Description of Related Art

An oxide filmfilm, such as a silicon oxide ($SiO_2$) film, and a nitride film, such as a silicon nitride (SiNx) film, are representative insulating films, and in a semiconductor manufacturing process, the silicon oxide film or the silicon nitride film is used alone or in a form in which one or more films are alternately stacked. In addition, the oxide film or the nitride film is also used as a hard mask for forming a conductive pattern such as a metal wiring.

In a wet etching process for removing the nitride film, a mixture of phosphoric acid and deionized water is generally used. The deionized water is added for preventing a decrease in an etching rate and a change in etching selectivity of the nitride film to an oxide film; however, there may be a problem arising in that defects may occur in a nitride film etching removal process even with a minute change in an amount of supplied deionized water. In addition, phosphoric acid is a strong acid and corrosive, thereby leading to difficulties in handling.

In order to solve the above problems, there is a conventionally known technology for removing a nitride film using an etching composition containing fluoric acid (HF), nitric acid ($HNO_3$), or the like, in phosphoric acid ($H_3PO_4$). This technology, however, results in reducing an etching selection ratio of the nitride film to the oxide film.

Further, there is also a known technology of using an etching composition including phosphoric acid and a silicate or a silicic acid. However, the silicic acid or silicate has a problem of generating particles which may affect a substrate, thereby being inappropriate for a semiconductor manufacturing process.

In the meantime, when phosphoric acid is used in a wet etching process for removing the nitride film, not only the nitride film but also an SOD oxide film may be etched due to a reduced etching selection ratio of the nitride film to the oxide film, whereby it is difficult to adjust an effective field oxide height (EFH). Accordingly, a sufficient wet etching time for removing the nitride film may not be secured, or an additional process may be required, causing a change in device characteristics and having adverse effects thereon.

Therefore, an etching composition having a high selection ratio, which selectively etches a nitride film to an oxide film and does not have a problem such as particle generation in a semiconductor manufacturing process, is currently demanded.

Meanwhile, a silane-based additive, which is an additive added to a conventional etching composition, has solubility too low to secure optimal solubility, thereby causing precipitation of particles in the etching solution composition and abnormal growth of a substrate. Such particles may remain on a silicon substrate, resulting in a defect of a device implemented thereon, or in failure of equipment used in an etching or a washing process.

Further, when the etching composition is stored for a long period time, etching speeds of a nitride film and a silicon oxide film changes, thereby varying selection ratio of the nitride film to the oxide film.

SUMMARY

An aspect of the present disclosure is to provide an etching composition having a high selection ratio, which can selectively remove a nitride film while minimizing an etching rate of an oxide film, without causing problems such as particle generation having adverse effects on device characteristics.

Another aspect of the present disclosure is to provide an etching composition having excellent storage stability.

Further, another aspect of the present disclosure is to provide a method for etching an insulating film using the etching composition and a method for manufacturing a semiconductor device.

The present disclosure of the present disclosure is to provide an etching composition. According to an embodiment of the present disclosure, an etching composition comprises phosphoric acid, a silane compound containing at least one silicon (Si) atom, and an organic phosphate represented by Formula 1:

[Formula 1]

In Formula 1, $R^1$ to $R^3$ are independently hydrogen, or a substituted or unsubstituted hydrocarbyl group, and at least one of $R^1$ to $R^3$ is a substituted or unsubstituted hydrocarbyl group.

The hydrocarbyl group may be a substituted or unsubstituted $C_1$-$C_{20}$ hydrocarbyl group, a substituted or unsubstituted $C_2$-$C_{20}$ alkenyl group, or a substituted or unsubstituted $C_6$-$C_{20}$ aryl group. For example, $R^1$ to $R^3$ may be a substituted or unsubstituted $C_1$-$C_{10}$ alkyl group, a substituted or unsubstituted $C_2$-$C_{10}$ alkenyl group, or a substituted or unsubstituted $C_6$-$C_{10}$ aryl group.

Formula 1 may be one selected from the structures (1) to (27) below:

(1)

-continued (15)

(16)

(17)

(18)

(19)

(20)

(21)

(22)

(23)

(24)

(25)

(26)

(27)

The silane compound may be represented by Formula 2:

[Formula 2]

In Formula 2, $R^{51}$ to $R^{54}$ are independently hydrogen, a substituted or unsubstituted hydrocarbyl group, or a substituted or unsubstituted heterohydrocarbyl group, and $R^{51}$ to $R^{54}$ exist independently, or two or more thereof form a ring, connected by a heteroatom.

The etching composition may include the phosphoric acid in an amount of 70 wt % to 95 wt %, the silane compound in an amount of 0.001 wt % to 5 wt %, and the organic phosphate in an amount of 0.001 wt % to 10 wt %.

The etching composition may further include an ammonium salt.

The present disclosure provides a method for etching an insulating film using any one of the etching compositions described above.

In addition, the present disclosure provides a method for manufacturing a semiconductor device, the method including sequentially forming a tunnel oxide film, a polysilicon film, a buffer oxide film and a pad nitride film on a substrate; forming a trench by selectively etching the polysilicon film, the buffer oxide film and the pad nitride film; forming an SOD oxide film to gap-fill the trench; performing a chemical mechanical polishing (CMP) process on the SOD oxide film using the pad nitride film as a polishing stop film; removing the pad nitride film by wet etching using any one of the etching compositions above; and removing the buffer oxide film.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

The present disclosure is to provide an etching composition, in particular, an etching composition having a high selection ratio enabling selective removal of a nitride film while minimizing an etching rate of an oxide film and having excellent storage stability.

The etching composition of the present disclosure includes phosphoric acid. The phosphoric acid may react with silicon nitride to etch a silicon nitride film, and react with the silicon nitride as in Equation (1) below:

$$3Si_3N_4+27H_2O+4H_3PO_4 \rightarrow 4(NH_4)_3PO_4+9SiO_2H_2O \qquad (1).$$

The phosphoric acid is contained in an amount of 70 wt % to 95 wt % based on a total weight of the etching composition. When the phosphoric acid is contained in an amount of less than 70 wt %, the nitride film is not easily removed. In contrast, when the phosphoric acid is contained in an amount greater than 95 wt %, a high selection ratio of the nitride film to the oxide film cannot be obtained.

For example, the phosphoric acid may be an aqueous phosphoric acid solution containing phosphoric acid in a concentration of 75% to 95%, but is not limited thereto. Water used in the aqueous phosphoric acid solution is not particularly limited, but deionized water may be used.

The etching composition of the present disclosure includes the organic phosphate represented by Formula 1 below:

[Formula 1]

In Formula 1, $R^1$ to $R^3$ are independently hydrogen, or a substituted or unsubstituted hydrocarbyl group. The hydrocarbyl group may be a substituted or unsubstituted $C_1$-$C_{20}$ alkyl group, a substituted or unsubstituted $C_2$-$C_{20}$ alkenyl group, or a substituted or unsubstituted $C_6$-$C_{20}$ aryl group. $R^1$ to $R^3$ may be different from each other, or two or more thereof may be identical. However, at least one of $R^1$ to $R^3$ is a substituted or unsubstituted hydrocarbyl group, while excluding a case in which all is hydrogen.

For example, $R^1$ to $R^3$ may be a substituted or unsubstituted $C_1$-$C_{20}$ alkyl group, such as methyl, ethyl or 2-ethylhexyl, a substituted or unsubstituted $C_2$-$C_{20}$ alkenyl group, such as —$CH_2CH(=CH_2)$, or a substituted or unsubstituted $C_6$-$C_{20}$ aryl group, such as benzyl. The substitution may be achieved with a halogen, such as Cl, F, or the like, an alkoxy group, —$NO_2$, or the like.

The organic phosphate represented by Formula 1 provided in the present disclosure provides structural stability to the silane compound and prevents decomposition or abnormal growth of the silane compound to suppress gelation of the etching compound and etching of the silicon oxide.

The organic phosphate contained in the etching composition may be used alone as long as it is represented by Formula 1 above, or two or more thereof may be mixed to use.

The organic phosphate employed in the present disclosure may be an organic phosphate of the following structures (1) to (27):

(1)

(2)

(3)

(4)

(5)

(6)

(7)

-continued

(8)

(9)

(10)

(11)

(12)

(13)

-continued (14)

(15)

(16)

(17)

(18)

(19)

(20)

(21)

In Formula 2, $R^{51}$ to $R^{54}$ are independently hydrogen, a substituted or unsubstituted hydrocarbyl group, such as a substituted or unsubstituted $C_1$-$C_{20}$ hydrocarbyl group, or a substituted or unsubstituted heterohydrocarbyl group, such as a substituted or unsubstituted $C_1$-$C_{20}$ heterohydrocarbyl group. $R^{51}$ to $R^{54}$ may exist independently, or two or more thereof may form a ring connected by a heteroatom. For example, $R^{51}$ to $R^{54}$ may be hydrogen, $C_1$-$C_{20}$ alkyl, $C_1$-$C_{20}$ heteroalkyl, or the like. In this case, the heteroatom is not particularly limited, but may be N, S, O, P, or the like.

The silane compound represented by Formula 2 may be included in an amount of 0.005 wt % to 1 wt %, based on a total weight of the etching composition.

Further, the etching composition may further include an ammonium salt, in addition to the organic phosphate represented by Formula 1, as an additive.

The ammonium salt is a compound having an ammonium ion, and those conventionally used in the art may be appropriately used in the present disclosure as well. Although not particularly limited, the ammonium salt may be, for example, ammonia water, ammonium chloride, ammonium acetate, ammonium phosphate, ammonium peroxydisulfate, ammonium sulfate, ammonium fluorate, or the like. These may be used alone or in a combination of two or more.

Furthermore, the etching composition of the present disclosure may further contain an optional additive conventionally used in the art to further improve etching performance. The additive may be a surfactant, a metal ion sequestrant, a corrosion inhibitor, or the like.

In the etching composition of the present disclosure, a remainder is a solvent. The solvent may be water, but is not particularly limited thereto.

The etching composition of the present disclosure is used for selective removal of a nitride film by etching from a semiconductor device including an oxide film and the nitride film. The nitride film includes a silicon nitride film, for example, a SiN film, a SiON film, or the like.

In addition, the oxide film may be at least one film selected from the group consisting of a silicon oxide film, for example, a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LPTEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization film (APL) film, an atomic film deposition (ALD) film, a plasma enhanced oxide (PE-oxide) film, an O3-tetraethyl orthosilicate (O3-TEOS) film or combinations thereof.

An etching method involving use of the etching composition of the present disclosure may be performed by a wet etching method, for example, dipping, spraying, or the like.

An example of an etching process using the etching composition of the present disclosure is schematized in The organic phosphate of Formula 1 may prevent gelation of the etching composition and may be added in an amount of 0.001 wt % to 10 wt % based on a total weight of the etching composition. When the organic phosphate is added in an amount of less than 0.001 wt %, it is difficult to obtain an effect of improving physical properties, which is reducing gelation, whereas if the amount exceeds 10 wt %, the organic phosphate may be gelled.

A content of the organic phosphate of Formula 1 may be, for example, 0.001 to 5 wt %, 0.001 to 3 wt %, 0.001 to 2 wt %, 0.001 to 1 wt %, 0.005 to 5 wt %, 0.005 to 3 wt %, 0.005 to 2 wt %, 0.005 to 1 wt %, 0.01 to 5 wt %, 0.01 to 3 wt %, 0.01 to 2 wt %, 0.01 to 1 wt %, 0.05 to 5 wt %, 0.05 to 3 wt %, 0.05 to 2 wt %, 0.05 to 1 wt %, 0.1 to 5 wt %, 0.1 to 3 wt %, 0.1 to 2 wt %, 0.1 to 1 wt %, 0.5 to 5 wt %, 0.5 to 3 wt %, 0.5 to 2 wt % or 0.5 to 1 wt %.

Figure 1:
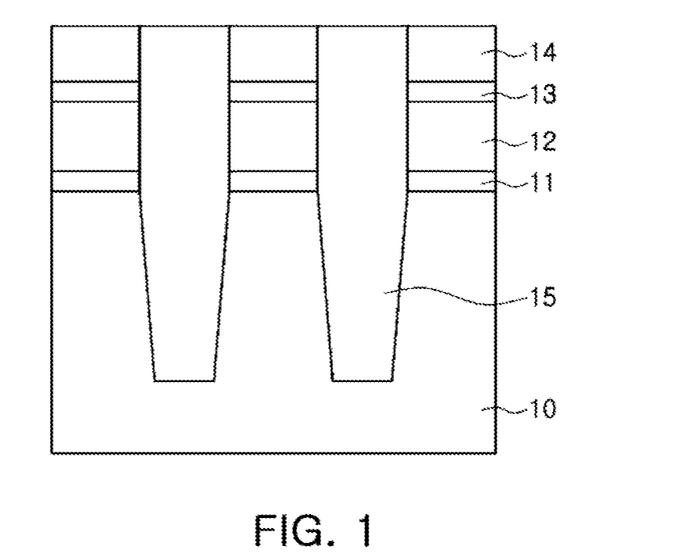
FIGS. 1 and 2 are process cross-sectional views illustrating a method for etching an insulating film according to an embodiment of the present disclosure.
Figure 2:
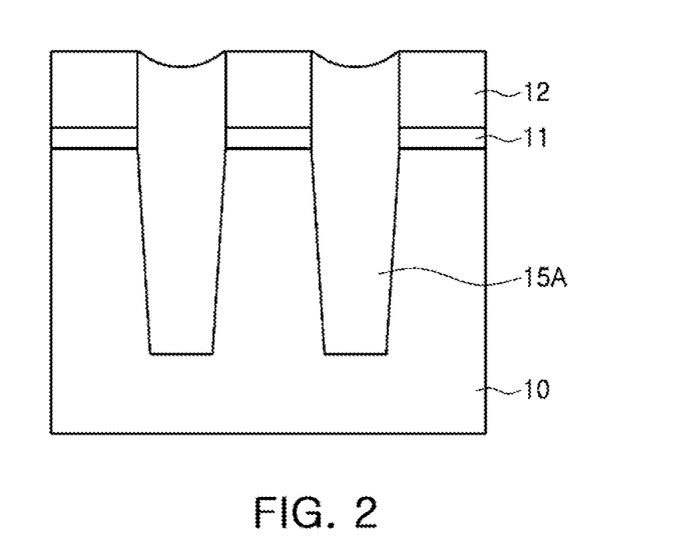

The etching composition includes a silane compound. Any silane compound including one or more silicon atoms may be appropriately used in the present disclosure. More preferably, the silane compound may be a silane compound represented by Formula 2 below:

FIGS. 1 and 2. FIGS. 1 and 2 are exemplary process cross-sectional views illustrating a device separation process of a flash memory device.

As illustrated in FIG. 1, a tunnel oxide film 11, a polysilicon film 12, a buffer oxide film 13 and a pad nitride film 14 are formed on a substrate 10 in said order, and the polysilicon film 12, the buffer oxide film 13 and the pad nitride film 14 are then selectively etched to form a trench. Subsequently, an SOD oxide film 15 is formed until the trench is gap-filled, and a CMP process is then carried out on the SOD oxide film 15 using the pad nitride film 14 as a polishing stop film.

As illustrated in FIG. 2, after the pad nitride film 14 is removed by wet etching using the etching composition provided in the present disclosure, the buffer oxide film 13 is removed in a washing process. As a result, a device separation film 15A is formed in a field area.

A temperature of the etching process may be in a range of 50° C. to 300° C., preferably 100° C. to 200° C., more preferably 156° C. to 163° C., and an appropriate temperature may be changed, if necessary, in consideration of other processes and factors.

As such, according to a method for manufacturing a semiconductor device including the etching process carried out using the etching composition of the present disclosure, selective etching of the nitride film is feasible when the nitride film and the oxide film are alternately stacked or mixed. In addition, stability and reliability of the process can be secured by preventing the generation of particles, which was problematic in the conventional etching process.

Accordingly, such a method may be efficiently applied to various processes requiring selective etching of the nitride film to the oxide film in the semiconductor device manufacturing process.

EXAMPLE

Hereinafter, the present disclosure will be described in detail by way of examples. The following Examples relate to an example of the present disclosure, but the present disclosure is not limited thereto.

Example 1

A substrate on which a silicon oxide (SiOx) film deposited at a thickness of 500 angstroms (Å) and a silicon nitride (SiN) film deposited at a thickness of 5000 Å was prepared on a semiconductor wafer. a concentration of As shown in Table 1, 99.4 wt of phosphoric acid with 85% concentration, 0.5 wt % of 3-aminopropylsilanetriol, and 0.1 wt % of trimethylphosphate (organic phosphate additive 1) were added and mixed to prepare an etching composition such that a total weight percentage becomes 100 wt %.

Example 2

The same method used in Example 1 was used, except that instead of the organic phosphate additive 1 of Example 1, triethylphosphate (organic phosphate additive 2) was used.

Example 3

The same method used in Example 1 was used, except that instead of the organic phosphate additive 1 of Example 1, triphenylphosphate (organic phosphate additive 3) was used.

Example 4

The same method used in Example 1 was used, except that instead of the organic phosphate additive 1 of Example 1, tris(2-chloroethyl)phosphate (organic phosphate additive 4) was used.

Example 5

The same method used in Example 1 was used, except that instead of the organic phosphate additive 1 of Example 1, tris(2-ethylhexyl)phosphate (organic phosphate additive 5) was used.

Comparative Example 1

The same method used in Example 1 was used, except that no organic phosphate additive was used.

Comparative Example 2

The same method used in Example 1 was used, except that instead of the organic phosphate additive 1 of Example 1, ammonium acetate (($NH_4$)OAc) was used.

<Preparation of Etching Composition and Measurement of Selection Ratio>

Each of the etching compositions obtained in Examples 1 to 5 and Comparative Examples 1 to 2 was added to a round flask, heated for 60 minutes to heat up to 158° C. The silicon wafer was then dipped into the etching composition for 720 seconds and 6000 seconds to perform an etching process.

A surface of the silicon wafer, on which a pattern was formed, was selectively etched, and thicknesses of the silicon oxide film and the silicon nitride film before and after etching were measured using Ellipsometry, thin film thickness measurement equipment (NANO VIEW, SEMG-1000). Based thereon, an etching speed of the silicon oxide film (SiO E/R, Å/min) and that of the nitride film (SiN E/R, Å/min) as well as selection ratios thereof were calculated, and a result thereof is shown in Table 1.

The selection ratio represents a ratio of a nitride film etching speed to an oxide film etching speed, and the etching speed is a value calculated by dividing a difference in the film thicknesses before and after etching by an etching time (minute).

TABLE 1

|  | Composition (wt %) | | Organic PA additive | Process | SiN E/R | SiO E/R | |
|---|---|---|---|---|---|---|---|
|  | 85% PA | 3-aminopropyl silanetriol | contents (type) | temp (° C.) | (Å/min) | (Å/min) | Selection Ratio |
| CE 1 | 99.5 | 0.5 wt % | — | 158 | 68.3 | 0.32 | 213 |
| CE 2 | 99.4 | 0.5 wt % | 0.1 wt % ($NH_4$)OAc | 158 | 72.7 | 0.21 | 346 |
| EX 1 | 99.4 | 0.5 wt % | 0.1 wt % (1) | 158 | 85.3 | 0.13 | 656 |
| EX 2 | 99.4 | 0.5 wt % | 0.1 wt % (2) | 158 | 81.7 | 0.15 | 545 |
| EX 3 | 99.4 | 0.5 wt % | 0.1 wt % (3) | 158 | 83.4 | 0.09 | 927 |

TABLE 1-continued

|  | Composition (wt %) | | Organic PA additive | | Process temp (° C.) | SiN E/R (Å/min) | SiO E/R (Å/min) | Selection Ratio |
| --- | --- | --- | --- | --- | --- | --- | --- | --- |
|  | 85% PA | 3-aminopropyl silanetriol | contents | (type) | | | | |
| EX 4 | 99.4 | 0.5 wt % | 0.1 wt % | (4) | 158 | 88.9 | 0.11 | 808 |
| EX 5 | 99.4 | 0.5 wt % | 0.1 wt % | (5) | 158 | 86.1 | 0.16 | 538 |

*CE: Comparative Example
**EX: Example

As shown in Table 1 above, it can be understood that remarkably high etching selection ratios are exhibited when the organic phosphate additives 1 to 5 are added to the etching composition as an additive, as compared to Comparative Examples 1 and 2. Further, in terms of the silicon nitride etching speed (SiN E/R), the etching compositions of Examples 1 to 5 exhibited a remarkably excellent effect as compared to that of Comparative Examples 1 and 2. As a result, it is confirmed that an etching composition optimized for an etching process of a silicon nitride film can be provided.

Based on the results, it is confirmed that use of the organic phosphates suggested in the present disclosure as additives may lead to improved active silicon-based structural stability. Accordingly, an etching composition having an improved etching speed of a silicon nitride film, a selection ratio and etching stability can be provided.

[Change in Etching Composition Over Time]

The etching compositions of Comparative Example 1 and Example 1 were stored at about 70° C. for a predetermined period of time and subject to an etching test every 7 days under the same conditions. A result thereof is shown in Table 2.

TABLE 2

|  | Period of storage | SiN E/R(Å/min) | SiO E/R(Å/min) | Selection ratio |
| --- | --- | --- | --- | --- |
| Comparative Example 1 | — | 68.3 | 0.32 | 213 |
|  | 7 days | 66.7 | 0.35 | 191 |
|  | 14 days | 65.1 | 0.36 | 181 |
|  | 21 days | 61.3 | 0.39 | 157 |
| Example 1 | — | 85.3 | 0.13 | 656 |
|  | 7 days | 85.1 | 0.13 | 655 |
|  | 14 days | 84.7 | 0.13 | 652 |
|  | 21 days | 89.4 | 0.11 | 812 |

As shown in Table 2 above, the etching composition of Comparative Example 1 after 21 days showed significantly reduced etching speeds (SiN E/R) and selection ratio. However, the etching composition of Example 1, to which the organic phosphate additive 1 is added, showed almost no change in the etching speeds (SiN E/R and SiO E/R) and selection ratio. This indicates that the etching composition according to an embodiment of the present disclosure has not only excellent etching speeds and selection ratio but also excellent storage stability, and thus can maintain superior etching characteristics even when stored for a long period of time.

Such results also indicate that the structural stability effect of organic phosphate additive 1 can maintain the function of inhibiting etching of SiO without abnormal growth or decomposition of 3-aminopropylsilanetriol.

The etching composition according to the present disclosure has a high etching selection ratio of a nitride film to an oxide film.

In addition, use of the etching composition of the present disclosure may prevent damage of film quality of the oxide film when removing the nitride film or deterioration of electric characteristics due to etching of the oxide film, as well as preventing generation of particles, thereby improving device characteristics.

While exemplary embodiments have been shown and described above, it will be apparent to those skilled in the art that modifications and variations could be made without departing from the scope of the present invention as defined by the appended claims.

What is claimed is:

1. An etching composition, comprising:
   an ammonium salt, phosphoric acid, a silane compound containing at least one silicon (Si) atom, and an organic phosphate represented by Formula 1 below:

(1)

wherein:
R$^1$ to R$^3$ are independently a substituted or unsubstituted hydrocarbyl group of a substituted C$_1$-C$_{20}$ alkyl group, a substituted or unsubstituted C$_2$-C$_{20}$ alkenyl group, or a substituted C$_6$-C$_{20}$ aryl group,
wherein the etching composition comprises the phosphoric acid in an amount of 70 wt % to 95 wt %, the silane compound in an amount of 0.001 wt % to 5 wt %, and the organic phosphate in an amount of 0.001 wt % to 10 wt %, and
wherein the etching composition comprises no silicic acid.

2. The etching composition of claim 1, wherein R$^1$ to R$^3$ are a substituted C$_1$-C$_{10}$ alkyl group, or a substituted C$_6$-C$_{10}$ aryl group.

3. The etching composition of claim 1, wherein the organic phosphate of Formula 1 is selected from the structures (6) to (15), (22), and (27) below:

(6)

(7)

(8)

(9)

(10)

(11)

(12)

(13)

(14)

(15)

(22)

(27)

4. The etching composition of claim 1, wherein the silane compound is represented by Formula 2 below:

(2)

wherein, in Formula 2,
$R^{51}$ to $R^{54}$ are independently hydrogen, a substituted or unsubstituted hydrocarbyl group, or a substituted or unsubstituted heterohydrocarbyl group, and $R^{51}$ to $R^{54}$ exist independently, or two or more thereof form a ring, connected by a heteroatom.

5. The etching composition of claim 1, comprising no compound comprising a silicon atom other than one or more of the silane compound containing the at least one silicon (Si) atom.

6. An etching composition, comprising:
ammonium salt, phosphoric acid, a silane compound containing at least one silicon (Si) atom, and an organic phosphate represented by Formula 1 below:

(1)

wherein:

$R^1$ to $R^3$ are independently hydrogen, or a substituted or unsubstituted $C_2$-$C_{20}$ alkenyl group, or a substituted or unsubstituted $C_6$-$C_{20}$ aryl group, and wherein, at least one of $R^1$ to $R^3$ is hydrogen, wherein the etching composition comprises the phosphoric acid in an amount of 70 wt % to 95 wt %, the silane compound in an amount of 0.001 wt % to 5 wt %, and the organic phosphate in an amount of 0.001 wt % to 10 wt %, and wherein the etching composition comprises no silicic acid.

7. The etching composition of claim 6, wherein $R^1$ to $R^3$ are independently a substituted or unsubstituted $C_2$-$C_{20}$ alkenyl group.

8. The etching composition of claim 6, wherein $R^1$ to $R^3$ are independently a substituted or unsubstituted $C_6$-$C_{10}$ aryl group.

9. The etching composition of claim 6, wherein the organic phosphate of Formula 1 is selected from the structures (16), (19), (21), (24), and (25) below:

(16)

(19)

(21)

(24)

(25)

10. The etching composition of claim 6, wherein the silane compound is represented by Formula 2 below:

(2)

wherein, in Formula 2, $R^{51}$ to $R^{54}$ are independently hydrogen, a substituted or unsubstituted hydrocarbyl group, or a substituted or unsubstituted heterohydrocarbyl group, and $R^{51}$ to $R^{54}$ exist independently, or two or more thereof form a ring, connected by a heteroatom.

11. An etching composition, comprising:
an ammonium salt;
phosphoric acid;
a silane compound of formula (2):

(2)

$R^{51}$ to $R^{54}$ independently being H, a substituted or unsubstituted hydrocarbyl group, or a substituted or unsubstituted heterohydrocarbyl group, two or more of $R^{51}$ to $R^{54}$ optionally forming a ring, connected by a heteroatom; and an organic phosphate of formula (1):

(1)

$R^1$ to $R^3$ independently being a substituted or unsubstituted $C_2$-$C_{20}$ alkenyl group, or a substituted or unsubstituted $C_6$-$C_{20}$ aryl group, wherein the etching composition comprises no silicic acid.

12. The etching composition of claim 11, comprising no compound comprising a silicon atom other than one or more of the silane compound of formula (1).

13. A method for etching an insulating film using the etching composition of claim 1.

14. A method for manufacturing a semiconductor device, comprising:

sequentially forming a tunnel oxide film, a polysilicon film, a buffer oxide film and a pad nitride film on a substrate;

forming a trench by selectively etching the polysilicon film, the buffer oxide film and the pad nitride film;

forming an SOD oxide film to gap-fill the trench;

performing a chemical mechanical polishing (CMP) process on the SOD oxide film using the pad nitride film as a polishing stop film;

removing the pad nitride film by wet etching using the etching composition of claim 1; and removing the buffer oxide film.

* * * * *